United States Patent [19]

Morizot et al.

[11] 4,205,120

[45] May 27, 1980

[54] MAGNETIC RECORDING ELEMENT

[75] Inventors: Henri Morizot; Andre Lucan, both of Belfort, France

[73] Assignee: Compagnie Internationale pour l'Informatique Cii-Honeywell Bull (Societe Anonyme), Paris, France

[21] Appl. No.: 934,849

[22] Filed: Aug. 18, 1978

[30] Foreign Application Priority Data

Sep. 7, 1977 [FR] France .............................. 77 27073

[51] Int. Cl.² ......................... B32B 15/00; G11B 5/00
[52] U.S. Cl. .................................... 428/676; 360/136; 428/928
[58] Field of Search ............... 428/928, 675, 636, 675, 428/676; 360/136, 119; 340/174 R, 174 NA, 174 QA

[56] References Cited

U.S. PATENT DOCUMENTS

| | | | |
|---|---|---|---|
| 2,999,766 | 9/1961 | Ashworth | 360/136 |
| 3,459,517 | 8/1969 | Feldtkeller et al. | 428/675 |
| 3,471,272 | 10/1969 | Wilhelm et al. | 428/928 |
| 3,702,239 | 11/1972 | Nagy et al. | 340/174 TF X |
| 3,715,793 | 2/1973 | Kefalas et al. | 428/928 |
| 3,756,788 | 9/1973 | Whetstone | 428/675 |
| 3,853,717 | 12/1974 | Diguilio | 340/174 PW X |
| 3,866,192 | 2/1975 | Ulmer | 428/675 |
| 3,886,052 | 5/1975 | Smith | 204/33 |

FOREIGN PATENT DOCUMENTS 2601916  7/1976  Fed. Rep. of Germany ........... 360/119

Primary Examiner—L. Dewayne Rutledge
Assistant Examiner—Peter K. Skiff
Attorney, Agent, or Firm—Kerkam, Stowell, Kondracki & Clarke

[57] ABSTRACT

A magnetic recording element made in accordance with the present invention comprises a layer of magnetic material applied to a carrier formed from a material of high magnetic permeability. A layer of non-ferrous, non-magnetic material is interposed between the carrier and the layer of magnetic material. The layer of non-magnetic material has a thickness between 20 and 40 microns. The magnetic recording element enables sharply defined magnetized domains to be obtained and is in a simple and repeatable fashion, by using a process in which the materials applied to the carrier of the element undergo no chemical transformation. To this end, the non-magnetic layer is produced by successively depositing, on the carrier which is used as a cathode, a first layer of copper obtained from an alkaline electrolytic solution, and then a second layer of copper which is obtained from an acid electrolytic solution.

14 Claims, 4 Drawing Figures

FIG:3
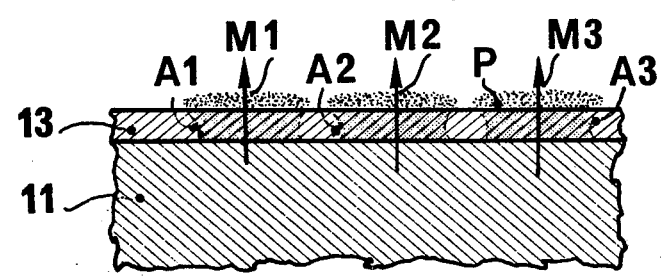
PRIOR ART.
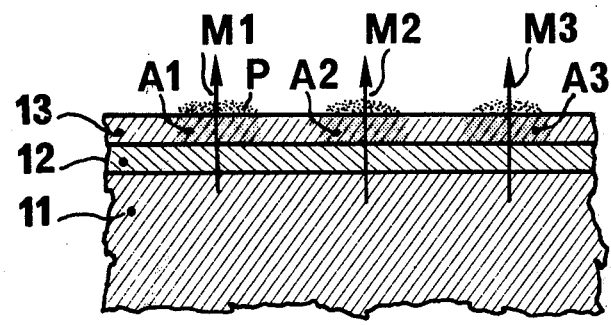
FIG:4

MAGNETIC RECORDING ELEMENT

BACKGROUND OF THE INVENTION

Field of the Invention

The present invention relates to a magnetic recording element which enables precisely defined domains of magnetization to be obtained.

To record data, it is known to use magnetic recording elements which consist essentially of a carrier covered with a layer of magnetic material, which carrier may take various forms such as, for example, a drum, a tape or a disc. Data is recorded on a recording element of this kind by means of at least one magnetic recording head in the vicinity of which the recording element moves, the head generally being formed by an electromagnet. To record a series of data items on the recording element, the electromagnet is energized at intervals, the effect of which is to create a series of small magnetic domains on the recording element.

To ensure that the recording element is suitably magnetized, while at the same time using an electrical current of only relatively small intensity to energize the head, it has been proposed to magnetize the element by the so-called "transverse" method, i.e. in such a way that in each of the magnetic domains formed on the element, the magnetic induction is perpendicular to the surface of the element. A recording element capable of being magnetized in this way is described and illustrated in particular in U.S. patent application Ser. No. 854,682 now U.S. Pat. No. 4,138,702, of Jean Georges Magnenet, filed on Nov. 25, 1977, as a continuation of U.S. patent application Ser. No. 651,156, now abandoned. Both of said applications are assigned to the assignee of the present invention.

The recording element which is described in these patent applications has a carrier made of a material of high magnetic permeability, such as soft iron or steel, this carrier being coated with a layer of magnetic material. This recording element can then be magnetized transversely by means of a recording head having a magnetic core on which a winding is wound, the core being formed in such a way as to have a recording pole and a flux-closing pole whose cross-section is greater than that of the recording pole, both these poles being situated close to the surface of the magnetic layer. The magnetic core and the carrier thus form a closed magnetic circuit having two air gaps, and the magnetic induction is thus perpendicular to the surface of the magnetic layer which passes through these two air gaps. However, the fact that the cross-section of the recording pole is considerably smaller than that of the flux-closing pole means that the level of magnetic induction in the air gap of the recording pole is sufficiently high to cause the magnetic layer to become magnetized whereas, in the air gap of the flux-closing pole, the level of magnetic induction is insufficient to magnetize the layer or interfere with the data recorded previously.

With a recording element of this kind, it is difficult to ensure that the magnetic domains are sharply defined. This fact, which it has been possible to demonstrate in particular by observing the orientation taken up by ferrous particles applied to the magnetized domains of such a recording element, proves particularly troublesome in cases where the recording element is intended for use in a magnetic printing machine such, for example, as that which is described and illustrated in a French patent application which was filed on Mar. 22, 1976 and published as No. 2,305,654. In this case, because latent magnetic images which are formed on the surface of the recording element and which correspond to images of the characters which are to be printed do not normally have sharply defined outlines, the characters which are printed often appear blurred and are even sometimes difficult to read.

SUMMARY OF THE INVENTION

The present invention overcomes these disadvantages and proposes a magnetic recording element which enables sharply defined magnetized domains to be obtained, this recording element being produced, in a simple and repeatable fashion, by using a process in which the materials applied to the carrier of the element undergo no chemical transformation.

In one particular embodiment of the invention, a magnetic recording element comprises a layer of magnetic material applied to a carrier formed from a material of high magnetic permeability. A layer of non-ferrous, non-magnetic material is interposed between the carrier and the layer of magnetic material.

BRIEF DESCRIPTION OF THE DRAWINGS

Other features and advantages of the invention will become apparent in the course of the following description, which is given by way of non-limiting example, and from reference to the accompanying drawings, in which:

FIG. 3 shows the way in which a magnetic powder distributes itself when applied to a prior art magnetic recording element, when this recording element has been transversely magnetized, and FIG. 4 shows the way in which a magnetic powder distributes itself when applied to a magnetic recording element produced in accordance with the invention, when this element has been transversely magnetized.

DESCRIPTION OF THE PREFERRED EMBODIMENTS

Figure 1:
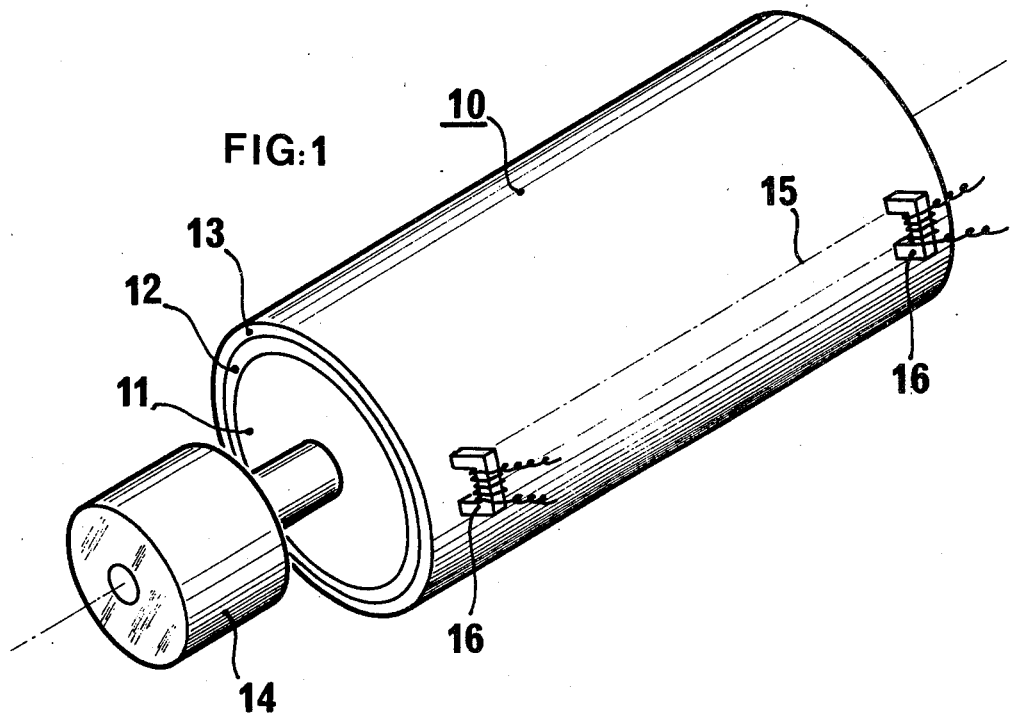
FIG. 1 shows a magnetic recording element produced in accordance with the invention.

The magnetic recording element which is shown in FIG. 1 forms part of a magnetic printing machine which is not shown in the drawings since it has no bearing on the invention. The recording element which is used in this machine is formed, as can be seen in FIG. 1, by a rotary magnetic drum 10. It should, however, be mentioned that the recording element could be of a form different from that shown in FIG. 1 and could, for example, be formed by a magnetic recording tape. It is, however, assumed that this magnetic recording element, no matter what its form, comprises a carrier formed by material having a high magnetic permeability, such as soft iron or steel. Thus, in the example illustrated in FIG. 1, the carrier is formed by a cylinder 11 of soft steel. This carrier is coated with a layer of a non-magnetic material 12 which will be discussed below, this layer 12 being covered in turn with a layer 13 of magnetic material. The magnetic drum 10 which is shown in FIG. 1 is driven in rotation by an electric motor 14. Data is recorded on the drum by means of a recording member 15 which is formed in the example being described, by an assembly consisting of a plurality of recording heads 16 which are arranged one beside the other in a line parallel to the axis of rotation of the drum, these heads being positioned close to the surface of the drum.

Figure 2:
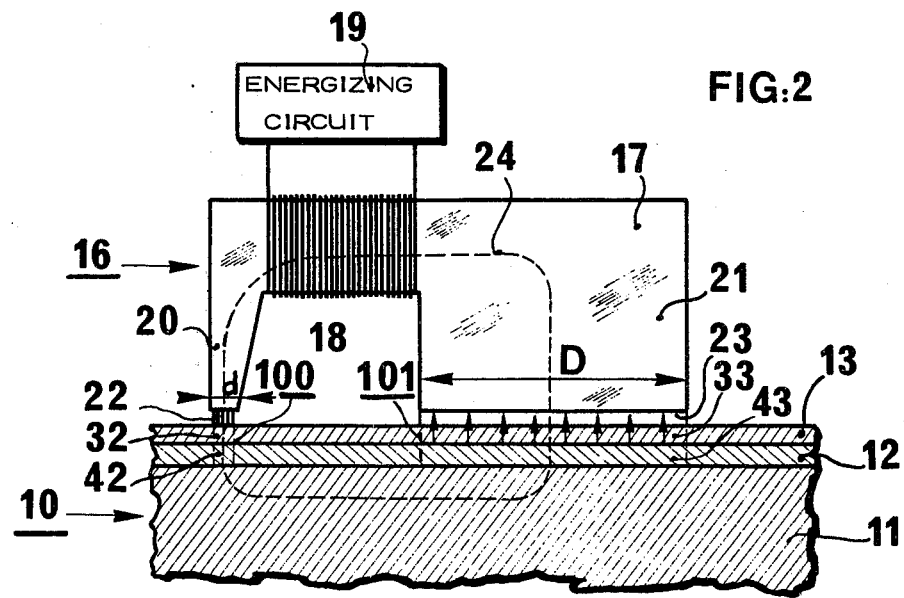
FIG. 2 is a view showing the principle on which a magnetic recording element produced in accordance with the invention is magnetized transversely.

Referring to FIG. 2, one of the recording heads is shown in detail. It can be seen that the head 16 includes a magnetic core 17 on which is wound a winding 18 connected to an external electrical energizing circuit 19. The outline of the magnetic core 17 is such that it has at its ends a recording pole 20 and a flux-closing pole 21.

As shown in FIG. 2, these two poles are situated close to the surface of the magnetic drum 10, with the result that the magnetic core 17, the carrier 11 and the two regions 100 and 101 which lie between the core and the carrier and which are at right angles to poles 20 and 21 respectively form a closed magnetic circuit. As can be seen in FIG. 2, where the core 17 is not in contact with the magnetic layer 13, each of these regions 100 and 101 (whose boundaries are marked by broken lines in the figure) consists of three zones, namely:

a zone 22 or 23 which, being situated in air, has a low magnetic permeability, a zone 32 or 33 which is situated in the magnetic layer 13 at right angles to a respective one of poles 20 and 21, and a zone 42 or 43 which is situated in the non-magnetic layer 12 at right angles to a respective one of poles 20 and 21.

It should, however, be mentioned that, in another embodiment, the poles 20 and 21 could be positioned in contact with the surface of the magnetic drum 10 and that under these conditions each of the regions 100 and 101 would then consist of only two zones, zones 22 and 23 being absent. As can be seen in FIG. 2, the width d of the recording pole 20 is very small in comparison with that D of the flux-closing pole 21. Under these conditions, if the electrical energizing circuit 19 transmits a current of intensity I to the winding 18, this current creates, within the magnetic core 17, a magnetic field whose mean line of force is represented by the broken line 24. In the region 100 associated with recording pole 20, this field is perpendicular to the surface of the magnetic layer 13 and the magnetization of the layer therefore does in fact take place transversely. In zone 32, the magnetic induction set up by the head 16 is greater than the saturation induction of the magnetic layer 13 and thus causes an elementary magnet to appear in the zone which remains in being even when the winding 18 no longer carries a current. On the other hand, in zone 33, because the width of the flux-closing pole 21 is greater than that of the recording pole 20 and because, as a result, the cross-sectional area of the magnetic circuit is far greater in zone 33 than in zone 32, the level of magnetic induction is very much less than the saturation induction of the magnetic layer 13 and so the flux-closing pole 21 is neither capable of causing data to be recorded in the layer 13 nor of causing the data already recorded in this layer to be altered.

If, after the magnetic layer 13 has been magnetized in the way which has just been described, a powder consisting of magnetic particles is applied to this layer by means of a known device such, for example, as that which is described and illustrated in French Pat. No. 2,209,322, this powder is attracted by the magnetized parts of the layer 13 and thus forms on the surface of the layer a pattern which represents the state of magnetization in layer 13. By way of example, FIG. 4 shows the way in which this powder P becomes distributed when it is applied to a recording element having a magnetic layer 13 covering a layer 12 of non-magnetic material which is in turn deposited on a carrier 11 made of a material of high magnetic permeability, this magnetic layer 13 having first been transversely magnetized by means of the recording head shown in FIG. 2 so that there are formed in the layer 13 a series of elementary magnets A1, A2, A3 whose respective axes of magnetization are marked M1, M2, M3. Similarly, FIG. 3 shows the way in which the powder becomes distributed when it is applied to a recording element which has been magnetized in exactly the same way as the recording element in FIG. 4 but which, unlike the latter, does not contain a non-magnetic layer. With reference to FIGS. 3 and 4, it can be seen that in the case illustrated in FIG. 3, the boundaries of the domains to which the powder P is restricted are not clearly defined whereas, in the case illustrated in FIG. 4, these boundaries can easily be seen. The result is that, when the recording element produced in accordance with the invention is used in a magnetic printing machine, the characters which are printed appear particularly sharp.

However, none of these advantages can be achieved unless the layer of non-magnetic material, which is interposed between the magnetic layer and the carrier made of a material of high magnetic permeability, is sufficiently thick. It is to be found that, if the magnetized domains in the magnetic layer are to be clearly defined, the thickness of the layer of non-magnetic material needs to be at least 20 microns. In the example described, the material which was selected to form the non-magnetic layer was copper, but it is understood that the layer could be made of any other non-magnetic material such as, for example, aluminium, silver, gold, zinc, or even a suitable synthetic material such as, for example, that which is produced by polymerizing the insulating lacquer which is described in French Pat. No. 2,098,620. It should however, be mentioned that this non-magnetic layer could not be made of a ferrous material, such as ferric oxide, for example, for the reason that such a material could not be covered with a magnetic layer without on the one hand being adversely affected and on the other hand diffusing into the magnetic layer and, thus, altering its characteristics.

It should also be pointed out that, if it is to be possible for the magnetic layer 13 to be magnetized properly and in particular for the undesirable effects of eddy currents to be avoided, the thickness of the non-magnetic layer 12 should not exceed a predetermined limiting value which, in cases where the layer 12 is formed from copper, has been found to be forty microns.

In addition, it is necessary that the magnetic layer 13 which is then deposited on the non-magnetic layer 12 should have a high coercive field and that its thickness should be at least ten microns. In the example described, this magnetic layer is formed from an alloy of cobalt, nickel, and phosphorous, the ratio between the different constituents of the layer being selected in such a way that the value of the coercive field of this layer is greater than 200 oersteds and may even be as much as 900 oersteds.

There will now be described the method which is employed to produce a magnetic recording element which, when it is transversely magnetized, enables precisely defined magnetic domains to be obtained. In what follows, the method is described as it applies to manufacturing a magnetic drum of the kind which is shown in FIG. 1.

To produce a magnetic drum of this kind, a cylinder of soft iron or steel is taken as a basis and is firstly subjected to a preparatory treatment, this treatment comprising the following operations:

- chemical degreasing, using boiling trichloroethylene, for approximately 5 minutes,
- electrolytic degreasing, using a solution containing sodium cyanide, soda and sodium carbonate, this degreasing being carried on for approximately 1 minute at a current density of the order of 15 A/dm$^2$,
- rinsing in running water,
- activation for 1 minute, using a 50% solution of hydrochloric acid,
- rinsing in running water.

Having undergone this preparatory treatment, the cylinder is then ready to receive a deposit of copper, this deposit being produced in the following way:

- an akaline copper coating is first produced on the cylinder, which is used as the cathode, employing an electrolyte solution containing copper cyanide, sodium cyanide, sodium carbonate, soda and Rochelle salt (sodium potassium tartrate), the operation taking place for approximately 2 minutes at a temperature of 35° C. and at a current density of 3.5A/dm$^2$. Under these conditions, a layer of copper approximately 2 microns thick is obtained,
- the cylinder which has been coated with this layer is then rinsed in running water and subjected to neutralization for 10 or so seconds using a 10% hydrochloric acid solution,
- after fresh rinsing, the cylinder, coated with a thin layer of copper, is copper plated a second time using an acid electrolytic bath containing copper sulphate, sulphuric acid and phenol, the operating taking place for approximately an hour and a half at ambient temperature and at a current density of the order of 5A/dm$^2$. Under these conditions a layer of copper is obtained whose thickness is of the order of 24 microns,
- after rinsing, the layer of copper is dressed mechanically so that its thickness is between 20 and 40 microns, for the reasons indicated above. In the example described its thickness is made equal to 30 microns. The cylinder, having been covered with copper in this way, is again subjected to a preparatory treatment similar to that described above, except that the activation is performed with a 10% hydrochloric acid solution instead of a 50% solution. A fresh alkaline copper plating operation is then performed which is similar to that described above, this operation being followed by rinsing. After this, the cylinder so prepared is subjected to preheating and then placed in an electrolysis vat containing a bath capable of depositing on it a magnetic layer which, for a thickness at least equal to 10 microns, has a coercive field of at least 200 oersteds. In the example described, this bath is formed by an aqueous solution containing salts of nickel and cobalt, sodium hypophosphate, ammonium chloride, and boric acid and the deposition of a magnetic layer of cobalt-nickel-phosphorous alloy takes place at a temperature of 40° C. for 25 minutes and at a current density of the order of 3.5/dm$^2$. In this way is obtained a layer of nickel/cobalt alloy whose thickness is close to 16 microns and which has a coercive field of the order of 600 oersteds.

The magnetic layer which has thus been deposited on the non-magnetic layer is then subjected to polishing. After this, the magnetic layer may be coated with a suitable protective layer to protect it on the one hand against the oxidizing effect of the air and on the other hand against the corrosive effects of moisture and of the various acids present in the atmosphere. This protective layer may be formed, for example, by a layer of nickel/tin alloy of the kind which is described in French Pat. No. 2,051,927.

The invention is not, of course, in any way restricted to the manners of putting it into effect described and illustrated, which are given merely as examples. On the contrary, the invention covers all means which form technical equivalents of those described and illustrated when taken separately or in combination and when used within the scope of the following claims.

We claim:

1. A magnetic recording element for use in a data storage unit provided with at least a magnetic recording head for recording information signals on said element, said recording element comprising:
   a metal carrier of high magnetic permeability having a first and a second layer of material thereon, said first layer being disposed on said carrier intermediate the carrier and the second layer and being a non-ferrous non-magnetic conductive metal having a thickness between 20 and 40 microns, and said second layer being of magnetic material disposed on said intermediate layer.

2. A magnetic recording element according to claim 1, wherein the metal of the first intermediate layer is copper, aluminum, silver, gold or zinc.

3. A magnetic recording element according to claim 1, wherein the metal of the carrier is soft iron.

4. A magnetic recording element for use in a data storage unit provided with at least a magnetic recording head for recording information signals on said element, said recording element comprising:
   a rotatable metal cylinder of high magnetic permeability having a first and a second layer thereon, said first layer being disposed on said cylinder intermediate the cylinder and the second layer and being a non-ferrous non-magnetic conductive metal, said first layer having a thickness between 20 and 40 microns, and said second layer being a magnetic material deposited on said intermediate layer.

5. A magnetic recording element according to claims 1 or 4 wherein the magnetic layer on the non-magnetic layer has a coercive field at least equal to 200 oersteds and its thickness is at least equal to 10 microns.

6. A magnetic recording element according to claim 4 wherein the metal of the first intermediate layer is copper, aluminum, silver, gold or zinc.

7. A magnetic recording element according to claim 4 wherein the metal of the cylinder is soft iron.

8. In a data storage unit the combination comprising a magnetic recording element and a row of magnetic recording heads associated therewith for recording information signals on said element, each said head including an electromagnet having a core and a winding wound on said core and connected to an energizing circuit to receive information signals sent by the circuit, each said core having a recording pole and a flux-closing pole the recording pole and flux-closing pole each having a pole face, the cross section of the pole face of the recording pole being smaller than that of the pole face of the flux-closing pole, said magnetic recording element comprising:

a metal carrier of high magnetic permeability having a first and a second layer of material thereon, said first layer being disposed on said carrier intermediate the carrier and the second layer and being a non-ferrous non-magnetic conductive metal having a thickness between 20 and 40 microns, and said second layer being of magnetic material disposed on said intermediate layer.

9. In a data storage unit as set forth in claim 8 wherein the metal of the first intermediate layer is copper, aluminum, silver, gold or zinc.

10. In a data storage unit as set forth in claim 8 wherein the metal of the carrier is soft iron.

11. In a data storage unit, the combination comprising a magnetic recording element and a row of magnetic recording heads for recording information signals on said element, each said head including an electromagnet having a core and a winding wound on said core and connected to an energizing circuit to receive information signals sent by said circuit, each said core having a recording pole and a flux-closing pole, the cross-section of the pole face of the recording pole being smaller than that of the pole face of the flux-closing pole, said magnetic element comprising:

a rotatable metal cylinder of high magnetic permeability having a first and a second layer thereon, said first layer being disposed on said cylinder intermediate the cylinder and the second layer and being a non-ferrous non-magnetic conductive metal, said first layer having a thickness between 20 and 40 microns, and said second layer being a magnetic material deposited on said intermediate layer.

12. The combination according to claim 11 wherein the metal of the first intermediate layer is copper, aluminum, silver, gold or zinc.

13. The combination according to claim 11 wherein the metal of the cylinder is soft iron.

14. A magnetic element according to claims 8 or 11 wherein the magnetic layer on the non-magnetic layer has a coercive field at least equal to 200 oersteds and its thickness is at least equal to 10 microns.

* * * * *